US012651975B2

(12) United States Patent
Lapassat et al.

(10) Patent No.: US 12,651,975 B2
(45) Date of Patent: Jun. 9, 2026

(54) SUBMODULE AND ASSOCIATED MODULE, TOWER, POWER CONVERTER, AND POWER SYSTEM

(71) Applicant: GE ENERGY POWER CONVERSION TECHNOLOGY LIMITED, Warwicksire (GB)

(72) Inventors: Nicolas Lapassat, Villebon-sur-Yvette (FR); Philippe Clavier, Villebon-sur-Yvette (FR); Christof Sihler, Villebon-sur-Yvette (FR); David Guerin, Villebon-sur-Yvette (FR)

(73) Assignee: GE ENERGY POWER CONVERSION TECHNOLOGY LIMITED, Warwicksire (GB)

( * ) Notice: Subject to any disclaimer, the term of this patent is extended or adjusted under 35 U.S.C. 154(b) by 132 days.

(21) Appl. No.: 18/433,011

(22) Filed: Feb. 5, 2024

(65) Prior Publication Data

US 2024/0305212 A1 Sep. 12, 2024

(51) Int. Cl.
H02M 7/00 (2006.01)
H02M 1/08 (2006.01)
(Continued)

(52) U.S. Cl.
CPC ............ H02M 7/003 (2013.01); H02M 1/08 (2013.01); H02M 1/327 (2021.05); H02M 7/4835 (2021.05); H02M 7/5387 (2013.01); H10W 90/00 (2026.01); H10W 40/611 (2026.01); H10W 40/613 (2026.01)

(58) Field of Classification Search
CPC ............. H01L 23/4006; H01L 23/4012; H01L 25/071; H01L 25/112; H01L 25/117; H01L 25/16; H01L 25/18; H02M 1/08; H02M 1/327; H02M 7/003; H02M 7/48; H02M 7/4835; H02M 7/4837; H02M 7/487; H02M 7/5387
See application file for complete search history.

(56) References Cited

U.S. PATENT DOCUMENTS

| | | | |
|---|---|---|---|
| 8,958,210 | B2 | 2/2015 | Hiller et al. |
| 2012/0068555 | A1 | 3/2012 | Aiello et al. |

(Continued)

FOREIGN PATENT DOCUMENTS

| | | |
|---|---|---|
| CN | 104753322 A | 7/2015 |
| CN | 112953274 A | 6/2021 |
| WO | WO-2016170910 A1 * 10/2016 | ............ H02M 1/088 |

OTHER PUBLICATIONS

Extended European Search Report for EP Application No. 23161344.9 dated Jul. 11, 2023, 8 pages.

*Primary Examiner* — Thienvu V Tran
*Assistant Examiner* — Shahzeb K Ahmad
(74) *Attorney, Agent, or Firm* — WOOD IP LLC; Theodore A. Wood

(57) ABSTRACT

A submodule for a power converter is described. The submodule includes a first and a second power storage devices and a first stack of electronic device packages. The first stack includes a first, a second, a third, and a fourth electronic device package. A first power device and the first and second electronic device packages form a first half bridge converter, and a second power device and the third and fourth electronic device packages form a second half bridge converter.

14 Claims, 7 Drawing Sheets

(51) Int. Cl.
| | |
|---|---|
| *H02M 1/32* | (2007.01) |
| *H02M 7/483* | (2007.01) |
| *H02M 7/5387* | (2007.01) |
| *H10W 90/00* | (2026.01) |
| *H10W 40/60* | (2026.01) |

(56) References Cited

U.S. PATENT DOCUMENTS

| | | | |
|---|---|---|---|
| 2014/0313642 A1 | 10/2014 | Zhang et al. | |
| 2015/0036398 A1* | 2/2015 | Garces ................. | H02M 7/487 |
| | | | 363/65 |
| 2016/0218615 A1 | 7/2016 | Senturk et al. | |
| 2020/0177097 A1* | 6/2020 | Takahashi ........... | H02M 7/5387 |
| 2023/0369664 A1* | 11/2023 | Yoscovich .......... | H01M 10/425 |
| 2024/0088110 A1* | 3/2024 | Zeyss ...................... | H01L 23/50 |

* cited by examiner

SUBMODULE AND ASSOCIATED MODULE, TOWER, POWER CONVERTER, AND POWER SYSTEM

CROSS-REFERENCE TO RELATED APPLICATIONS

This application claims priority to European Patent Application Serial Number EP23161344.9, filed Mar. 10, 2023, which is herein incorporated by reference.

TECHNICAL FIELD

The present invention concerns power systems comprising power converters, and relates more particularly to a submodule for a power converter.

The present invention further relates to a module comprising such a submodule, a tower comprising such modules, and a power converter comprising such towers.

BACKGROUND

Power converters for example for oil and gas applications, traction drives and high-power conversion equipment, for example rectifiers, inverters, and for static synchronous compensator STATCOM typically include press-pack power devices.

Each press-pack power device includes for example insulated gate bipolar transistors IGBTs, MOSFET or Injection Enhanced Gate Transistor IEGT.

Generally, the press-pack power devices of a power converter are connected to power storage devices to form full bridge converters, each full bridge converter comprising a power storage device and four press-pack power devices.

For some applications, for example for some power conversion applications, the implementation of full bridge converters in a power converter is oversized, these applications only requiring the functionalities of half bridge converters.

A half bridge converter comprises a power storage device and only two press-pack power devices.

It is known to implement full bridge converters for applications requiring only half bridge converters.

However, the implementation of full bridge converters for applications requiring the functionalities of half bridge converters deteriorates the efficiency of the power converter and the complexity of the control circuit of the press-pack power devices.

As each full bridge converter comprising two times more press-pack power devices as a half bridge converter, the conduction losses generated by the IGBTs of the press-pack power devices are doubled and the number of IGBTs to control is doubled.

It is therefore proposed to remedy whole or some of the disadvantage related to power converters according to the prior art.

SUMMARY

In view of the foregoing the invention proposes a submodule for a power converter comprising a first and a second power storage devices and a first stack of electronic device packages, the first stack comprising a first, a second, a third, and a fourth electronic device packages, a first and a second end contact surfaces, and a first and a second terminals.

Each electronic device package comprises an upper contact surface, a lower contact surface, and controlled switch configured to control a current flowing between the upper contact surface and the lower contact surface of the said electronic device package.

The second electronic device package is sandwiched between the first and the third device packages, and the third device package is sandwiched between the second and the fourth device packages so that the upper contact surface of an electronic device package is operatively in contact with the lower contact surface of another electronic device package.

One contact surface of the upper and lower contact surfaces of the first electronic device package is operatively in contact with the second electronic device package, and the other contact surface of the upper and lower contact surfaces of the first electronic device package is the first end contact surface of the first stack, the first end contact surface being operatively in connected with a first end of the first power storage device, the first and second electronic device packages being operatively in contact with the first terminal.

One contact surface of the upper and lower contact surfaces of the fourth electronic device package is operatively in contact with the third electronic device package, and the other contact surface of the upper and lower contact surfaces of the fourth electronic device package is the second end contact surface of the first stack, the second end contact surface being operatively in contact with a first end of the second power storage device, the third and fourth electronic device packages being operatively in contact with the second terminal.

The surface of the upper and lower contact surfaces of the second electronic device package operatively in contact with the third electronic device package is further operatively in contact with the second end of the first and the second power storage devices.

The first power device and the first and second electronic device packages form a first half bridge converter, and the second power device and the third and fourth electronic device packages form a second half bridge converter.

Advantageously, the submodule comprising a first connection and a second connection, the first connection being connected to the first terminal of the first stack and the second connection being connected to the second terminal of the first stack.

Preferably, the submodule further comprises a first connection and a second connection, a wedge, a third and a fourth power storage devices, and a second stack of electronic device packages, the second stack comprising a fifth, a sixth, a seventh, and an eighth electronic device packages, a third and a fourth end contact surfaces, and a third and a fourth terminals.

The sixth electronic device package is sandwiched between the fifth and the seventh electronic device packages, and the seventh electronic device package is sandwiched between the sixth and the eighth electronic device packages so that the upper contact surface of an electronic device package is operatively in contact with the lower contact surface of the other electronic device package.

One contact surface of the upper and lower contact surfaces of the fifth electronic device package is operatively in contact with the sixth electronic device package, and the other contact surface of the upper and lower contact surfaces of the fifth electronic device package is the third end contact surface of the second stack, the third end contact surface being operatively in contact with a first end of the third power storage device, the fifth and sixth electronic device packages being operatively in contact with the third terminal.

One contact surface of the upper and lower contact surfaces of the eighth electronic device package is operatively in contact with the seventh electronic device package, and the other contact surface of the upper and lower contact surfaces of the eighth electronic device package is the fourth end contact surface of the second stack, the fourth end contact surface being operatively in contact with a first end of the fourth power storage device, the seventh and eighth electronic device packages being operatively in contact with the fourth terminal.

The surface of the upper and lower contact surfaces of the sixth electronic device package operatively in contact with the seventh electronic device package and is operatively in contact with the second end of the third and the fourth power storage devices.

The third power device and the fifth and sixth electronic device packages form a third half bridge converter, and the fourth power device and the seventh and eighth electronic device packages form a fourth half bridge converter.

The wedge is sandwiched between the first and the second stacks, one terminal of the first and second terminals being connected to one terminal of the third and fourth terminals, the other terminal of the first and second terminals being connected to the first connection and the other terminal of the third and fourth terminals being connected to the second connection.

Preferably, each power storage device comprises a housing, the housing being connected to the second end of the said power storage device.

Advantageously, when a half-bridge of the submodule is defect, the submodule further comprising a connection between the terminal associated with the defect half-bridge and the second end of the power storage devices associated with the defect half-bridge.

Preferably, each controlled switch comprises a field effect transistor or an Injection Enhanced Gate Transistor (IEGT).

Advantageously, the submodule further comprises electronic device package heatsinks, each electronic device package being sandwiched between two heatsinks, the heatsinks being configured to cool each electronic device package.

Another object of the invention relates to a module comprising a submodule as defined above and two compacting devices, each stack of the submodule being compacted between the two compacting devices. Preferably, each compacting device comprises an insulated plate in contact with a stack of the submodule, a pressure cone and a clamping plate, the pressure cone being sandwiched between the insulated plate and the clamping plate, a plurality of tie rods connecting the clamping plates of the two compacting devices.

Advantageously, each compacting device comprises an insulated plate in contact with a stack of the submodule and a pressure cone, the pressure cones of the two compacting devices being connected by a clamping bar.

Advantageously, the module comprises only the first stack, one of the clamping plates is connected to the second end of the power storage devices of the first stack.

Preferably, the module comprises the first stack and the second stack, one of the clamping plates is connected to the one terminal of the first and second terminals connected to one terminal of the third and fourth terminals.

Another object of the invention relates to a tower comprising a plurality of stacked modules as defined above, the electronic device packages of the modules being connected in series to form an arm for a multilevel power converter.

Another object of the invention relates to a power converter comprising at least a first tower as defined above and a second tower as defined above, both towers having a same number electronic device packages, the electronic device packages of the first tower forming an upper arm and the electronic device packages of the second tower forming a lower arm, the upper arm being operatively coupled to the lower arm via a connecting node to form a phase leg.

Advantageously, the power converter further comprises a controller configured to control the controlled switches.

Another object of the invention relates to a power system comprising a power source, a power converter as defined above, and a load or a source, the converter being configured to exchange electrical energy between the power source and the load or the source.

BRIEF DESCRIPTION OF THE DRAWINGS

Other characteristics and advantages of the invention will emerge on reading the following description of embodiments of the invention, provided solely by way of non-limiting examples and with reference to the drawings in which.

DETAILED DESCRIPTION

Figure 1:
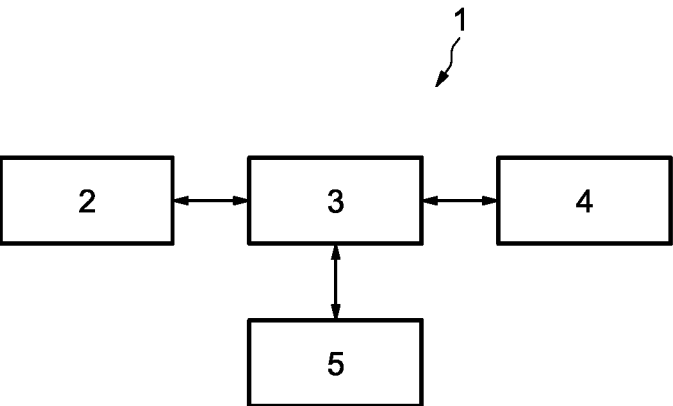
FIG. 1 illustrates an example of a system for performing power conversion according to the invention.

Specifically, FIG. 1 illustrates an example of a system 1 for performing power conversion.

The system 1 includes a source 2, a multi-level power converter 3, and a load/source 4. The term source, as used herein, refers to a renewable power source, a non-renewable power source, a generator, a grid, a fuel cell, an energy storage (when discharged), and the like. Also, the term load, as used herein, may refer to a motor, an electrical appliance, an energy storage (when re-charged) and the like.

In addition, the power converter 3 may be a multilevel converter. The power source 2 may be operatively coupled to a first terminal (not shown) of the power converter 3. A second terminal (not shown) of the power converter 3 may be operatively coupled to the source/load 4. The first terminal and the second terminal may be alternatively employed as an input terminal or an output terminal of the power converter 3.

The system 1 further includes a controller 5. The controller 5 controls the operation of the power converter 3 by controlling switching of a plurality of controlled switches within modules of the power converter 3.

The power source 2 may be a three-phase alternative current (AC) power source.

Figure 2:
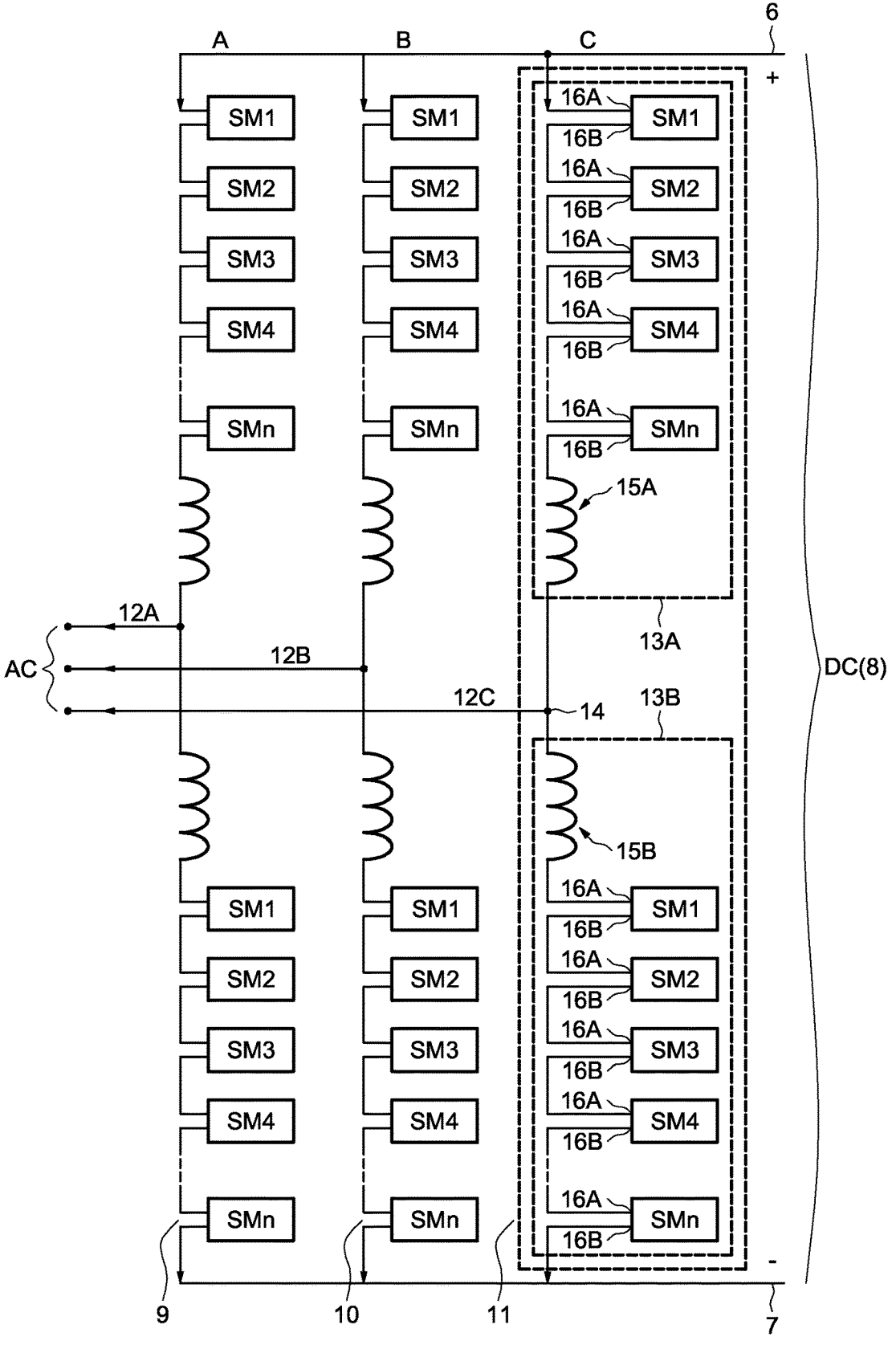
FIG. 2 illustrates a block diagram of a power converter according to one embodiment of the disclosure.
Figure 3:
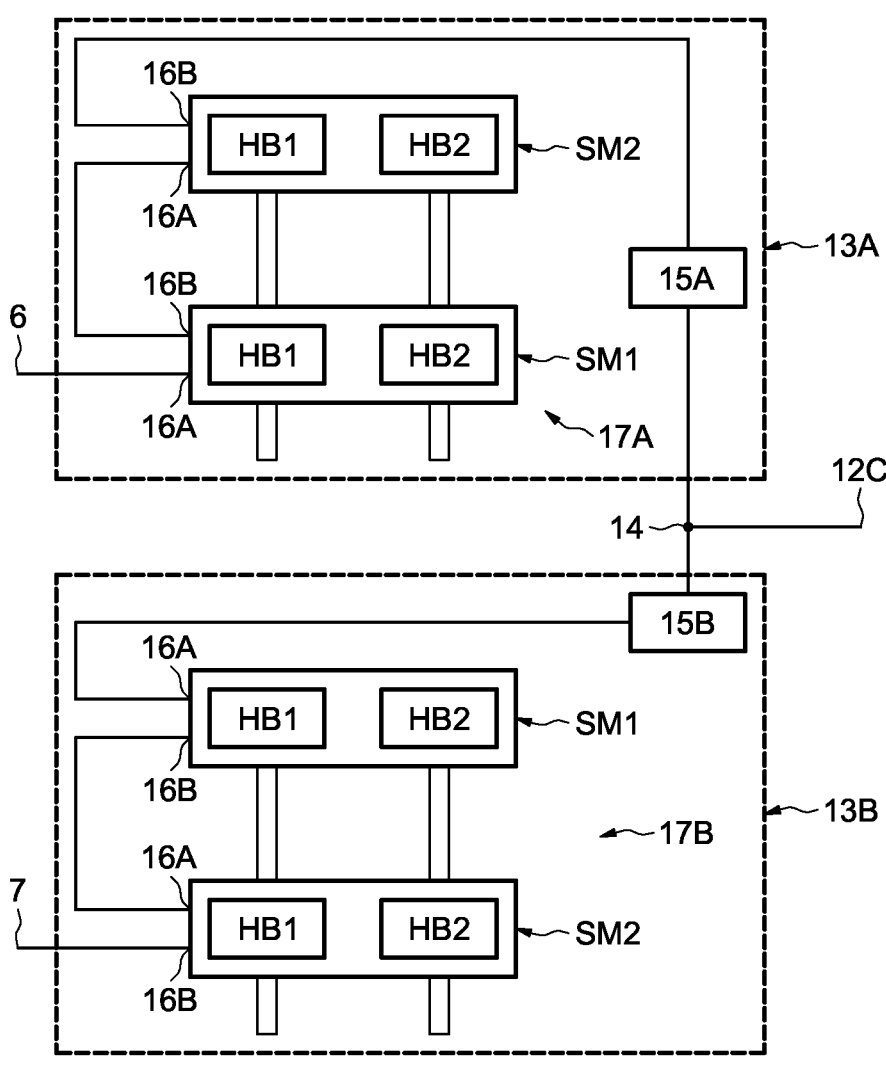
FIG. 3 illustrates schematically an example of an arrangement of the modules of the power converter of FIG. 2.

FIGS. 2 and 3 illustrate an example of the power converter 3.

In particular, FIG. 2 illustrates a block diagram of the power converter 3 and FIG. 3 illustrates schematically an example of an arrangement of the modules of the power converter 3.

In FIG. 2, the power converter 3 has an ABC 3-phase structure including positive and negative direct current (DC) voltage rails 6 and 7 respectively.

The number of phases of the power converter 3 is identical to the number of phases of the power source 2.

The positive and negative rails 6 and 7 form DC terminals 8. Each of the 3-phases (A, B, and C) corresponds to one of phase legs 9, 10, and 11.

Each phase of the power source 2 is connected to a different AC terminal 12A, 12B, 12C of the power converter 3.

A first phase leg 9 of the power converter 3 is connected to a first AC terminals 12A, a second phase leg 10 is connected to a second AC terminals 12B, and the third phase leg 11 is connected to a third AC terminals 12C.

By way of example, the third phase leg 11 includes an upper arm 13A and an identical lower arm 13B. In the example of FIG. 2, the upper and lower arms (13A and 13B) are connected together via a connecting node 14, the connecting node 14 being connected to the third AC terminal 12C.

The upper arm 13A extends between the positive rail 6 and the connecting node 14 and the lower arm 13B extends between the negative rail 7 and the connecting node 14.

Each of the upper and lower arms 13A, 13B comprises a plurality of modules SM1-SMn and an arm inductor 15A, 15B.

The upper arm 13A and the lower arm 13B may comprise a same number of modules SM1-SMn.

Each module SM1-SMn comprises a first connection 16A and a second connection 16B.

The plurality of modules SM1-SMn of each arm 13A, 13B are connected in series so that the first connection 16A of one module of one arm 13A, 13B is connected to the second connection 16B of an adjacent module of the said arm.

The first remaining connection of the module SM1 of the upper arm 13A is connected to the positive rail 6 and the second remaining connection of the module SMn of the upper arm 13A is connected to a first end of the inductor 15A.

The second end of the inductor 15A is connected to the connecting node 14.

The first remaining connection of the module SM1 of the lower arm 13B is connected to a first end of the inductor 15B.

The second end of the inductor 15B is connected to the connecting node 14.

The second remaining connection of the module SMn of the lower arm 13B is connected to the negative rail 7.

The remaining connection of a module is the end of the said module which is not connected to an end of another module.

In variant, the modules SM1-SMn of the upper arm 13A are connected in series so that the second remaining connection of a module of the said arm is connected to the positive rail 6 and the modules SM1-SMn of the lower arm 13B are connected in series so that the first remaining connection of a module of the said arm is connected to the negative rail 7.

The discussion regarding the third phase leg 11 equally applies to the first and second phase legs 9 and 10.

Each module of the modules SM1-SMn form two half-bridge converters.

For clarity reasons, it is assumed that each upper and lower arm 13A, 13B includes two modules SM1, SM2.

As the first, second and third phase legs 9, 10, and 11 are identical, FIG. 3 illustrates schematically an example of the arrangement of the modules SM1, SM2 of the third phase leg 11.

The modules SM1, SM2 of the upper arm 13A are stacked in a first tower 17A and the modules SM1, SM2 of the lower arm 13B are stacked in a second tower 17B.

The first tower 17A and the second tower 17B comprise the same number of modules SM1, SM2 and may each comprise more than two modules SM1, SM2.

Each module SM1, SM2 of the upper arm 13A and lower arm 13B comprises at least two half-bridge converters HB1, HB2.

The first connection 16A of a first module SM1 of the upper arm 13A is connected to the positive rail 6, the second connection 16B is connected to the first connection 16A of the second module SM2 of the upper arm 13A, and the second connection 16B of the second module SM2 is connected to the first end of the inductor 15A of the upper arm 13A.

The second end of the inductor 15A of the upper arm 13A is connected to the connecting node 14.

The first connection 16A of a first module SM1 of the lower arm 13B is connected to the first end of the inductor 15B of the lower arm 13B, the second connection 16B is connected to the first connection 16A of the second module SM2 of the lower arm 13B, and the second connection 16B of the lower arm 13B is connected to the negative rail 7.

The second end of the inductor 15B of the lower arm 13B is connected to the connecting node 14.

As each module SM1, SM2 comprises at least two half bridge converters HB1, HB2, the power converter 3 made of modules SM1-SMn stacked in towers is more compact and need less space than a known power converter from the prior art.

Figure 4:
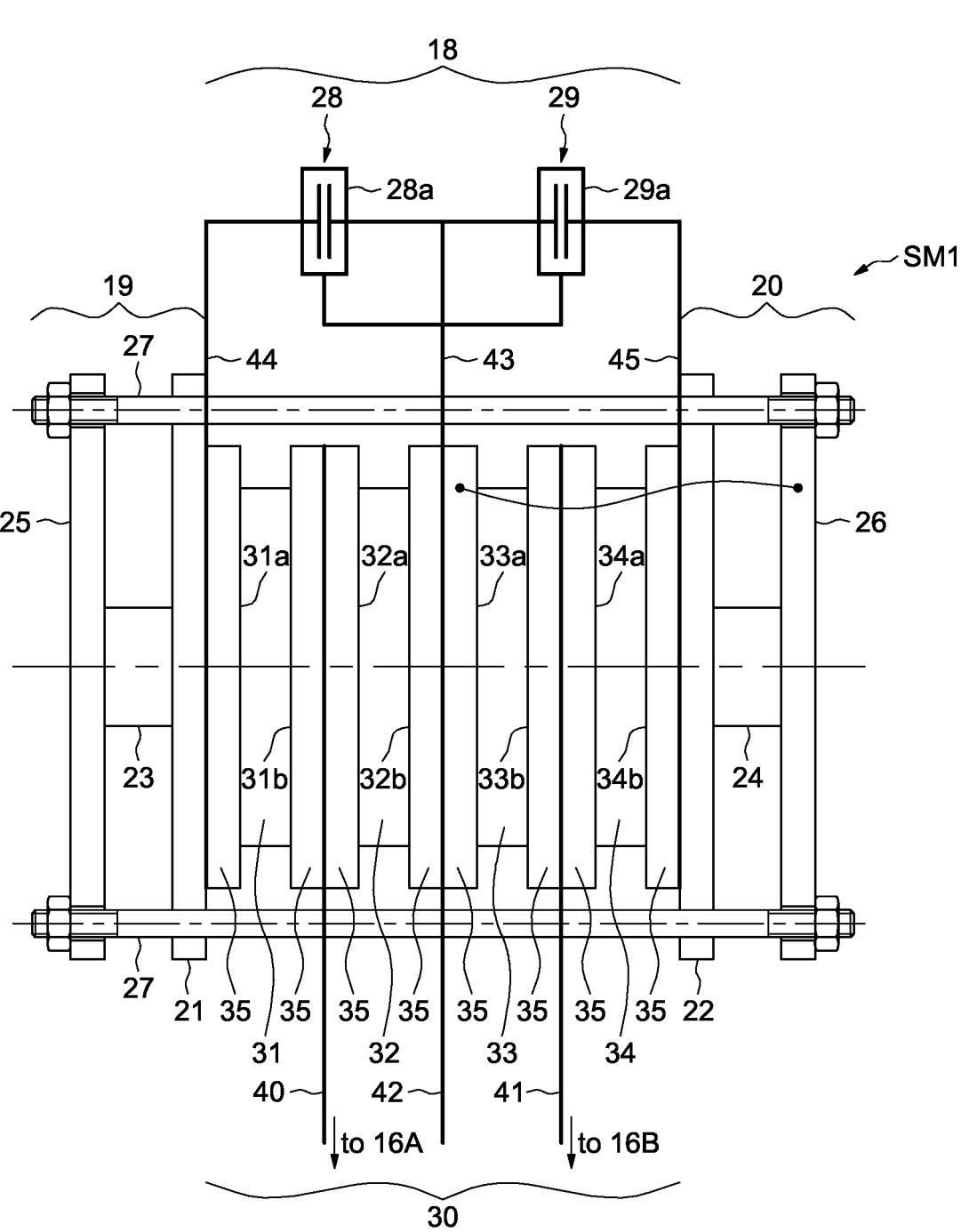
FIG. 4 illustrates a first example of the arrangement of the module SM1.
Figure 5:
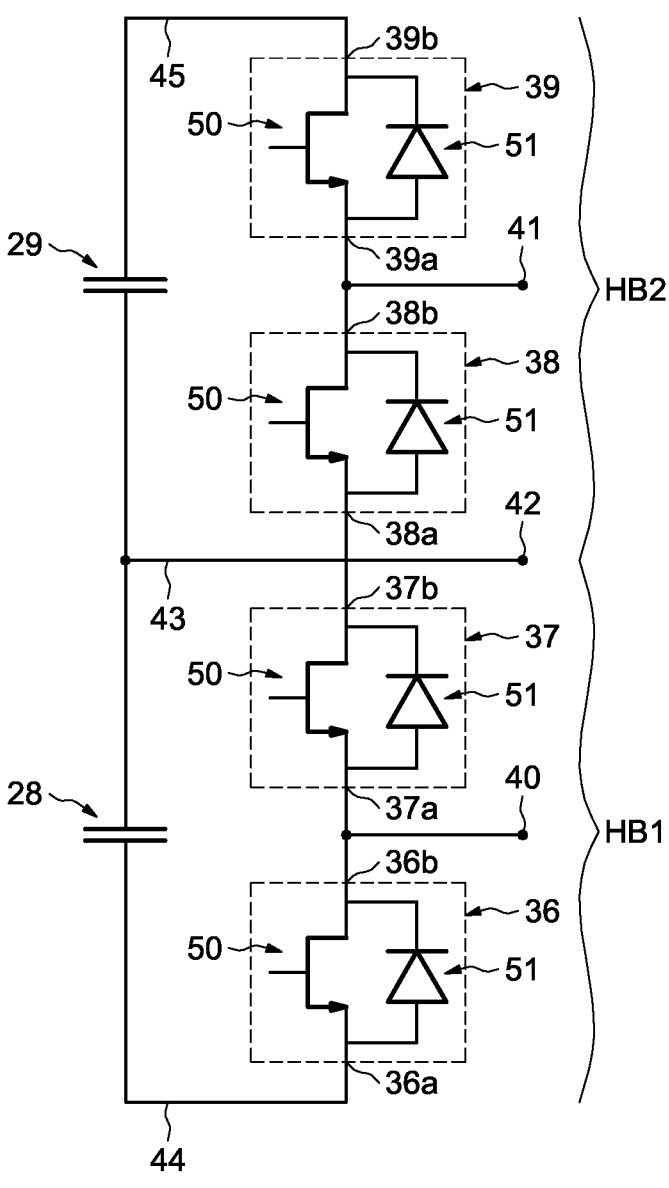
FIG. 5 illustrates an example of a block diagram of the module SM1 associated to the first example of the arrangement of the module SM1 according to FIG. 4.

As the modules SM1-SMn are identical, FIGS. 4 and 5 illustrate schematically a first exemplary embodiment of the module SM1.

In particular, FIG. 4 illustrates a first example of the arrangement of the module SM1 and FIG. 5 illustrates an example of a block diagram of the module SM1 associated to the first example of the arrangement of the module SM1.

In FIG. 4, the module SM1 comprises a first embodiment of a submodule 18.

The submodule 18 comprises a first power storage device 28, a second power storage device 29, and a first stack 30 of electronic device packages comprising a first electronic device package 31, a second electronic device package 32, a third electronic device package 33, and a fourth electronic device package 34.

The first stack 30 is compacted between two compacting devices 19, 20.

Each compacting device 19, 20 comprises an insulated plate 21, 22, a pressure cone 23, 24, and a clamping plate 25, 26.

The pressure cone 23, 24 is sandwiched between the compaction plate 21, 22 and the clamping plate 25, 26.

Each compaction plate 21, 22 is in contact with a different end of the first stack 30.

A plurality of tie rods 27 connect the two clamping plates 25, 26 to maintain the first stack 30 compacted between the two compaction plates 21, 22.

The compacting devices 19, 20 may be done differently, for example the compacting devices 19, 20 may comprise the compaction plates 21, 22 and the pressure cones 23, 24, the pressure cones 23, 24 being connected by a clamping bar to maintain compacted the submodule 18 compacted between the two compaction plates 21, 22.

The first stack 30 further may comprise electronic device package heatsinks 35 so that each electronic device package 31, 32, 33, 34 is sandwiched between two heatsinks 35 to cool each electronic device package.

The heatsinks 35 are made of an electrically conductive material, for example an aluminium alloy.

Each electronic device package 31, 32, 33, 34 may be cylindrical and comprises an upper contact surface 31*a*, 32*a*, 33*a*, 34*a* and a lower contact surface 31*b*, 32*b*, 33*b*, 34*b* in contact with heatsinks 35.

Each electronic device package 31, 32, 33, 34 further comprises a controlled switch 36, 37, 38, 39 (represented on FIG. 5) controlled by the controller 5 and controlling a current flowing between the upper contact surface 31*a*, 32*a*, 33*a*, 34*a* and the lower contact surface 31*b*, 32*b*, 33*b*, 34*b* of the said electronic device package 31, 32, 33, 34.

Each controlled switch 36, 37, 38, 39 may comprise a field effect transistor associated with an antiparallel power diode, for example an insulated gate bipolar transistor IGBT associated with an antiparallel power diode, an injection enhanced gate transistor IEGT associated with an antiparallel power diode, an integrated gate commutated thyristors IGCT associated with an antiparallel power diode or thyristors associated with an antiparallel power diodes and gate turn-off thyristor GTO associated with an antiparallel power diode.

The second electronic device package 32 is sandwiched between the first and the third device packages 31, 33.

The third device package 33 is sandwiched between the second and the fourth device packages 33.

The electronic device packages 31, 32, 33, 34 are stacked so that the upper contact surface of an electronic device package 31, 32, 33, 34 is operatively in contact with the lower contact surface of an adjacent electronic device package.

A current flows between two contact surfaces operatively in contact or between a contact surface and a lead, even if the two surfaces or the contact surface and the lead are separated by part(s) made of an electrically conductive material, for example heatsink(s) 35.

The contact surface of the first electronic device package 31 which is not operatively in contact with a contact surface of the second electronic device package 32 forms a first end contact surface of the first stack 30 and the contact surface of the fourth electronic device package 34 which is not operatively in contact with a contact surface of the third electronic device package 33 forms a second end contact surface of the first stack 30.

For example, the upper contact surface 32*a* of the second electronic device package 32 is operatively in contact with the lower contact surface of the first electronic device package 31. The upper contact surface 33*a* of the third electronic device package 33 is operatively in contact with the lower contact surface 32*b* of the second electronic device package 32. The upper contact surface 34*a* of the fourth electronic device package 34 is operatively in contact with the lower contact surface 33*b* of the third electronic device package 33.

The upper contact surface 31*a* of the first electronic device package 31 forms the first end contact surface and the lower contact surface 34*b* of the fourth electronic device package 34 forms the second end contact surface.

The lower contact surface 31*b* of the first electronic device package 31 and the upper contact surface 32*a* of the second electronic device package 32 are operatively in contact with a first terminal 40 of the submodule 18. The first terminal 40 is electrically in contact between the heatsinks 35 in contact with the lower contact surface 31*b* of the first electronic device package 31 and with the upper contact surface 32*a* of the second electronic device package 32. The first terminal 40 may be connected to the first connection 16A of the module SM1.

The lower contact surface 33*b* of the third electronic device package 33 and the upper contact surface 34*a* of the fourth electronic device package 34 are operatively in contact with a second terminal 41 of the submodule 18. The second terminal 41 is electrically in contact between the heatsinks 35 in contact with the lower contact surface 33*b* of the third electronic device package 33 and with the upper contact surface 34*a* of the fourth electronic device package 34. The second terminal 41 may be connected to the second connection 16B of the module SM1.

The lower contact surface 32*b* of the second electronic device package 32 and the upper contact surface 33*a* of the third electronic device package 33 are operatively in contact with the second end of the first and second power storage devices 28, 29, and may be operatively in contact with a third terminal 42 of the submodule 18.

The third terminal 42 of the first stack 30 and a first lead 43 are electrically in contact between the heatsinks 35 in contact with the lower contact surface 32*b* of the second electronic device package 32 and with the upper contact surface 33*a* of the third electronic device package 33. The first lead 43 is connected to the second end of the first and second power storage devices 28, 29.

Each power storage devices 28, 29 comprise one or more internal capacitor elements storing electric energy and may comprise a housing 28*a*, 29*a*.

The housing 28*a* of the first power storage device 28 is connected to the second end of the said power storage device 28, and the housing 29*a* of the second power storage device 29 is connected to the second end of the said power storage device 29.

A stray capacitance is formed between the internal capacitor elements of the power storage device 28, 29 and the housing 28*a*, 29*a* of the said power storage device 28, 29. Such connexion enables to connect the stray capacitance in parallel to the internal capacitor elements of the said power storage device 28, 29 so that the stray capacitance does not affects the switching behaviour of the controlled switches power electronics devices 36, 37, 38, 39, and does not generate stray currents during switching of the controlled switches 36, 37, 38, 39.

One of the two clamping plates 25, 26 is connected to the second end of the power storage devices 28, 29.

The pressure cones 23, 24, the clamping plates 25, 26 and the tie rods 27 may be made of electric conductive material such as steel.

The connection of one of the two clamping plates 25, 26 to the second end of the power storage devices 28, 29 reduces the voltage stress between the compacting device 19 comprising the pressure cones 23, 24, the clamping plates 25, 26 and the tie rods 27, and the elements of the stack 30, in particular between the tie rods 27 and the heatsinks 35.

In variant, the submodule 18 does not comprise the third terminal 42.

The heatsink 35 in contact with the first end contact surface is connected with a second lead 44 to a first end of the first power storage device 28. The second lead 44 is inserted between the said heatsink and the electrical insulating plate 21.

The heatsink 35 in contact with the second end contact surface is connected with a third lead 45 to a first end of the second power storage device 29. The third lead 45 is inserted between the said heatsink 35 and the electrical insulating plate 22.

The first end contact surface is operatively in contact with the first end of the first power storage device 28 and the second end contact surface is operatively in contact with the first end of the second power storage device 29.

FIG. 5 represents the controlled switches 36, 37, 38, 39 connected with the first, second and third leads 43, 44, 45 to the first and second power storage devices 28, 29.

Each controlled switch 36, 37, 38, 39 comprises a first connection 36a, 37a, 38a, 39a electrically in contact with the upper surface 31a, 32a, 33a, 34a of the electronic device package 31, 32, 33, 34.

Each controlled switch 36, 37, 38, 39 further comprises a second connection 36b, 37b, 38b, 39b electrically in contact with the lower surface 31b, 32b, 33b, 34b of the electronic device package 31, 32, 33, 34.

It is assumed that each controlled switch 36, 37, 38, 39 comprises a field effect transistor 50 and an antiparallel power diode 51.

The drain of the transistor 50 and the cathode of the antiparallel power diode 51 are connected to the second connection 36b, 37b, 38b, 39b of the controlled switch 36, 37, 38, 39.

The source of the transistor 50 and the anode of the antiparallel power diode 51 are connected to the first connection 36a, 37a, 38a, 39a of the controlled switch 36, 37, 38, 39.

The gate of the transistor 50 is connected to the controller 5.

The controlled switch 36 of the first electronic device package 31, the controlled switch 37 of the second electronic device package 32, and the first power device 28 form the first half bridge converter HB1.

Similarly, the controlled switch 38 of the third electronic device package 33, the controlled switch 39 of the fourth electronic device package 34, and the second power device 29 form the second half bridge converter HB2.

When the module SM1 comprises the third terminal 42, if the first half bridge converter HB1 is defect, a connection is established between the first terminal 40 and the third terminal 42 to bypass the defect first half bridge converter HB so that the module SM1 is still transferring electrical energy between the first and second terminals 40, 41.

Similarly, if the second half bridge converter HB2 is defect, a connection is established between the second terminal 41 and the third terminal 42 to bypass the defect second half bridge converter HB2.

Figure 6:
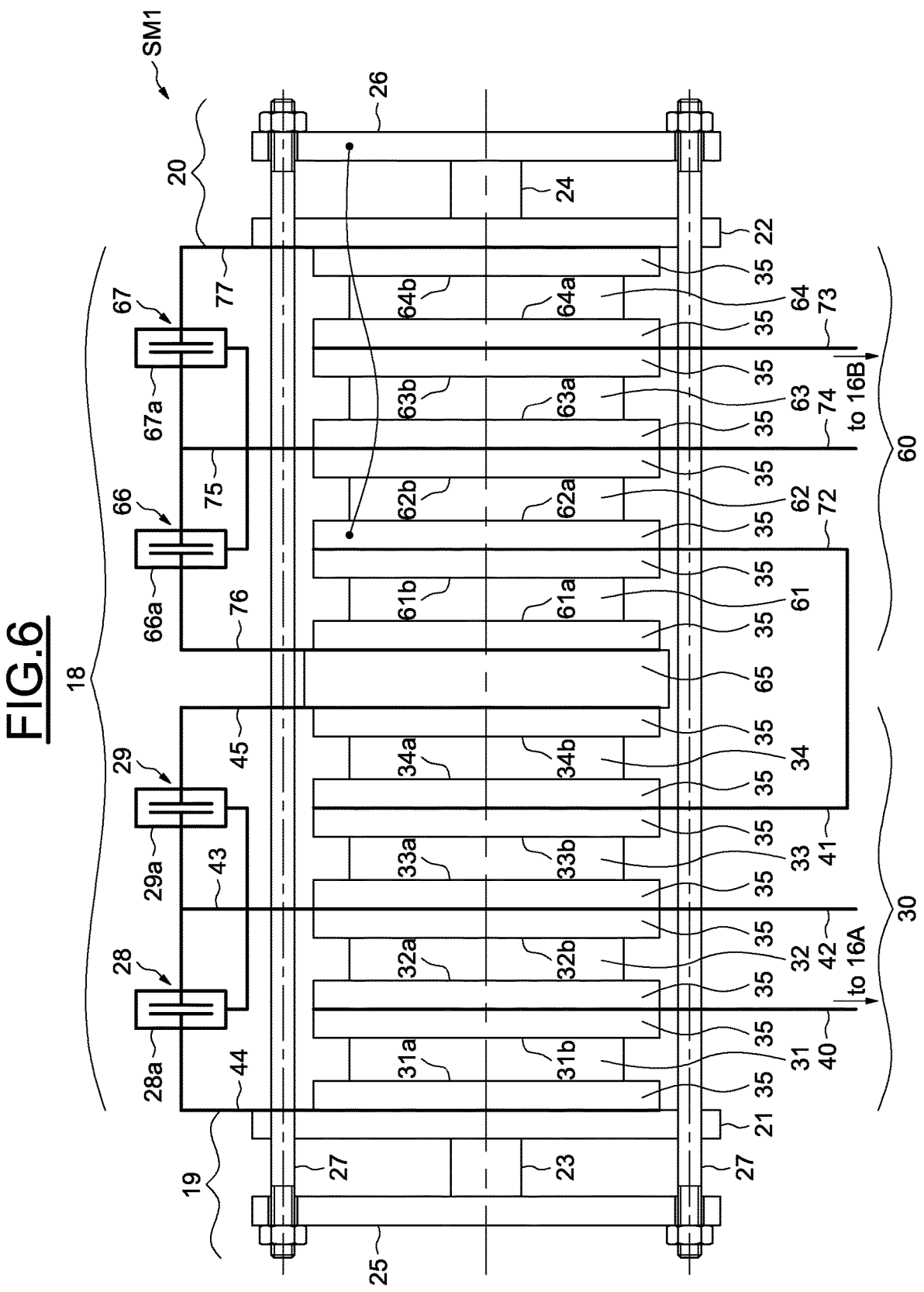
FIG. 6 illustrates a second example of the arrangement of the module SM1.
Figure 7:
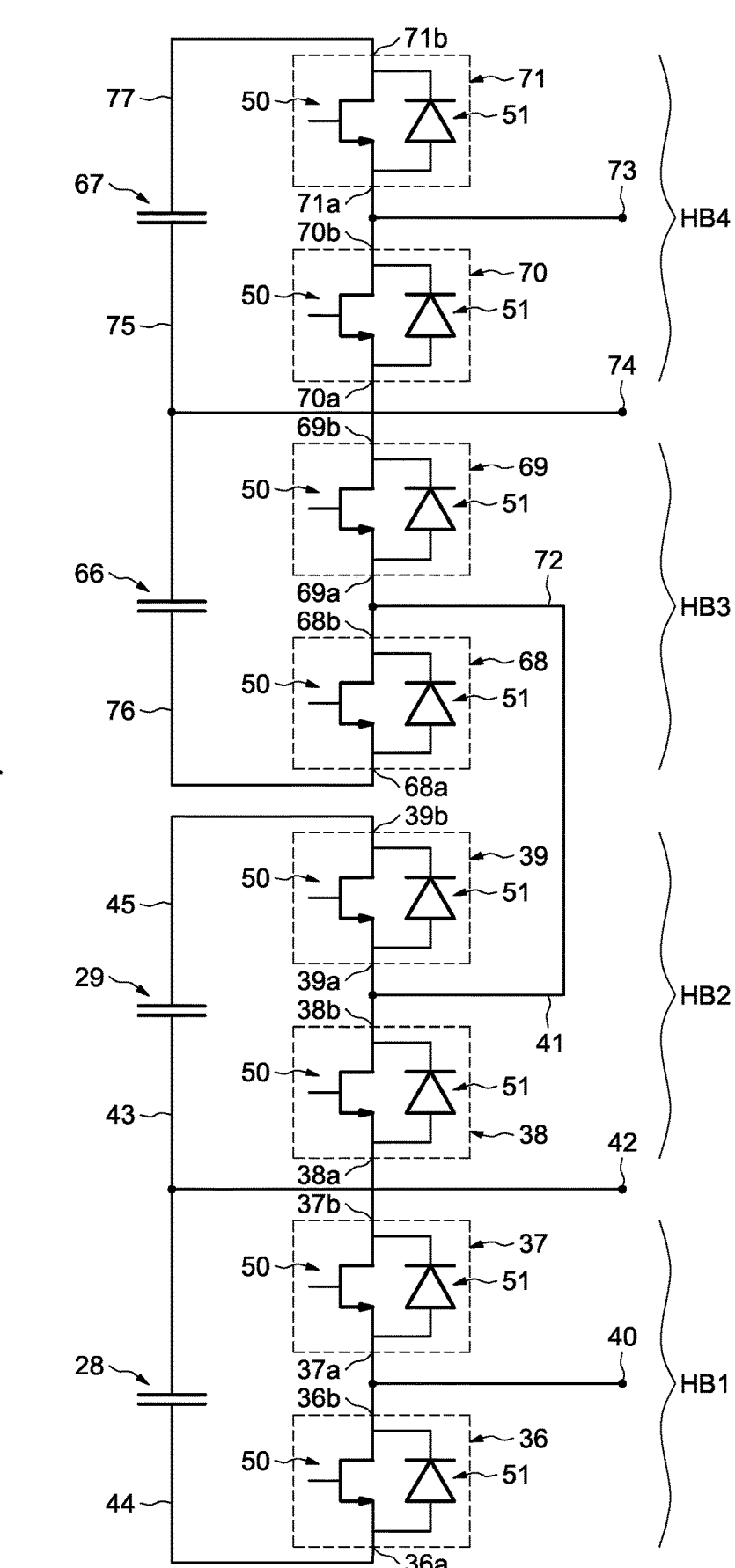
FIG. 7 illustrates an example of a block diagram of the module SM1 associated to the second example of the arrangement of the module SM1 according to FIG. 6.

As the modules SM1-SMn are identical, FIGS. 6 and 7 illustrate schematically a second exemplary embodiment of the module SM1.

FIG. 6 illustrates a second example of the arrangement of the module SM1 and FIG. 7 illustrates an example of a block diagram of the module SM1 associated to the second example of the arrangement of the module SM1.

In FIG. 6, the module SM1 comprises a second embodiment of the submodule 18 comprising four half bridge converters.

The submodule 18 is compacted between the two compacting devices 19, 20.

The submodule 18 comprises the first stack 30, the first and second power devices 28, 29, the first, second, and third the leads 43, 44, 45 and the first, second and third terminals 40, 41, 42 as described above.

The submodule 18 further comprises a second stack 60 of electronic device packages 61, 62, 63, 64, a wedge 65, a third power storage device 66, and a fourth power storage device 67.

Each electronic device package 61, 62, 63, 64 may be cylindrical and comprises an upper contact surface 61a, 62a, 63a, 64a and a lower contact surface 61b, 62b, 63b, 64b in contact with heatsinks 35.

Each electronic device package 61, 62, 63, 64 further comprises a controlled switch 68, 69, 70, 71 (represented on FIG. 7) controlled by the controller 5 and controlling a current flowing between the upper contact surface 61 a, 62a, 63a, 64a and the lower contact surface 61b, 62b, 63b, 64b of the said electronic device package 61, 62, 63, 64.

Each controlled switch 61, 62, 63, 64 may comprise a field effect transistor associated with an antiparallel power diode, for example an insulated gate bipolar transistor IGBT associated with an antiparallel power diode, an injection enhanced gate transistor IEGT associated with an antiparallel power diode, an integrated gate commutated thyristors IGCT associated with an antiparallel power diode or thyristors associated with an antiparallel power diodes and gate turn-off thyristor GTO associated with an antiparallel power diode.

The sixth electronic device package 62 is sandwiched between the fifth and the seventh device packages 61, 63.

The seventh device package 63 is sandwiched between the sixth and the eighth device packages 62, 64.

The electronic device packages 61, 62, 63, 64 are stacked so that the upper contact surface of an electronic device package 61, 62, 63, 64 is operatively in contact with the lower contact surface of an adjacent electronic device package.

The contact surface of the fifth electronic device package 61 which is not operatively in contact with a contact surface of the sixth electronic device package 62 forms a third end contact surface of the second stack 60 and the contact surface of the eighth electronic device package 64 which is not operatively in contact with a contact surface of the seventh electronic device package 63 forms a fourth end contact surface of the second stack 60.

For example, the upper contact surface 62a of the sixth electronic device package 62 is operatively in contact with the lower contact surface 61b of the fifth electronic device package 61. The upper 17 contact surface 63a of the seventh electronic device package 63 is operatively in contact with the lower contact surface 62b of the sixth electronic device package 62. The upper contact surface 64a of the eighth electronic device package 64 is operatively in contact with the lower contact surface 63b of the seventh electronic device package 63.

The upper contact surface 61a of the fifth electronic device package 61 forms the third end contact surface and the lower contact surface 64b of the eight electronic device package 64 forms the fourth end contact surface.

The lower contact surface 61b of the fifth electronic device package 61 and the upper contact surface 62a of the sixth electronic device package 62 are operatively in contact with a fourth terminal 72 of the submodule 18. The fourth terminal 72 is electrically in contact between the heatsinks 35 in contact with the lower contact surface 61*b* of the fifth electronic device package 61 and with the upper contact surface 62*a* of the sixth electronic device package 62.

The lower contact surface 63*b* of the seventh electronic device package 63 and the upper contact surface 64*a* of the eighth electronic device package 64 are operatively in contact with a fifth terminal 73 of the submodule 18. The fifth terminal 73 is electrically in contact between the heatsinks 35 in contact with the lower contact surface 63*b* of the seventh electronic device package 63 and with the upper contact surface 64*a* of the eighth electronic device package 64.

The lower contact surface 62*b* of the fifth electronic device package 62 and the upper contact surface 63*a* of the seventh electronic device package 63 are operatively in contact with a second end of the third and fourth power storage devices 66, 67, and may be operatively in contact with a sixth terminal 74 of the submodule 18.

The sixth terminal 74 of the second stack 60 and a fourth lead 75 are electrically in contact between the heatsinks 35 in contact with the lower contact surface 62*b* of the sixth electronic device package 62 and with the upper contact surface 63*a* of the seventh electronic device package 63. The fourth lead 75 is connected to a second end of the third and fourth power storage devices 66, 67.

In variant, the submodule 18 does not comprise the sixth terminal 74.

The wedge 65 is sandwich between the first and second stacks 30, 60.

The wedge 65 is made of an electrically non-conductive material or comprises electrical insulating layers so that a current does not flow through the wedge 65.

It is assumed that the wedge 65 is made of an electrically non-conductive material.

In this embodiment, the heatsink 35 in contact with the third end contact surface of the first stack 30 is sandwiched between a first face of the wedge 65 and the fourth electronic device package 34.

The third lead 45 is inserted between the said heatsink 35 and the first face the wedge 65 and is connected to the first end of the second power storage device 29.

The heatsink 35 in contact with the third end contact surface of the second stack 60 is sandwiched between a second face of the wedge 65 and the fifth electronic device package 61.

The second face of the wedge 65 is opposite to the first face.

A fifth lead 76 is inserted between the said heatsink 35 and the second face of the wedge 65 and is connected to the first end of the third power storage device 66.

The heatsink 35 in contact with the fourth end contact surface is sandwiched between the eighth electronic device package 64 and the second insulated plate 22, the electrical insulating being inserted between the said heatsink 35 and the second insulated plate 22. A sixth lead 77 is inserted between the said heatsink 35 and the second insulated plate 22, and connects the said heatsink 35 to the first end of the fourth power storage device 67.

The third end contact surface is operatively in contact with the first end of the third power storage device 66 and the fourth end contact surface is operatively in contact with the first end of the fourth power storage device 67.

The first terminal 40 is connected to the first connection 16A of the module SM1, the second terminal 41 is connected to the fourth terminal 72, and the fifth terminal 73 is connected to the second connection 16B of the module SM1.

Each power storage devices 66, 67 may comprise one or more internal capacitor elements storing electric energy and a housing 66*a*, 67*a*.

The housing 66*a* of the third power storage device 66 is connected to the second end of the said power storage device 66, and the housing 67*a* of the fourth power storage device 67 is connected to the second end of the said power storage device 67.

A stray capacitance is formed between the internal capacitor elements of the power storage device 66, 67 and the housing 66*a*, 67*a* of the said power storage device 66, 67. Such connexion enables to connect the stray capacitance in parallel to the internal capacitor elements of the said power storage device 66, 67 so that the stray capacitance does not affects the switching behaviour of the controlled switches 68, 69, 70, 71, and does not generate stray currents during switching of the controlled switches 68, 69, 70, 71.

One of the two clamping plates 25, 26 is connected to the second terminal 41 and the fourth terminal 72 to reduce the voltage stress between the compacting device 19 comprising the pressure cones 23, 24, the clamping plates 25, 26 and the tie rods 27, and the elements of the stacks 30, 60, in particular between the tie rods 27 and the heatsinks 35.

FIG. 7 represents the controlled switches 36, 37, 38, 39, 68, 69, 70, 71 connected with the leads 43, 44, 45, 75, 76, 77 to the first, second, third and fourth power storage devices 28, 29, 66, 67.

The controlled switches 36, 37, 38, 39, 68, 69, 70, 71 of the first and the second stacks 30, 60 may be identical.

Each controlled switch 68, 69, 70, 71 comprises a first connection 68*a*, 69*a*, 70*a*, 71*a* electrically in contact with the upper surface 61*a*, 62*a*, 63*a*, 64*a* of the electronic device package 61, 62, 63, 64.

Each controlled switch 68, 69, 70, 71 further comprises a second connection 68*b*, 69*b*, 70*b*, 71*b* electrically in contact with the lower surface 61*b*, 62*b*, 63*b*, 64*b* of the electronic device package 61, 62, 63, 64.

It is assumed that each controlled switch 68, 69, 70, 71 comprises the field effect transistor 50 and the antiparallel power diode 51.

The drain of the transistor 50 and the cathode of the antiparallel power diode 51 are connected to the second connection 68*b*, 69*b*, 70*b*, 71*b* of the controlled switch 68, 69, 70, 71.

The source of the transistor 50 and the anode of the antiparallel power diode 51 are connected to the first connection 68*a*, 69*a*, 70*a*, 71*a* of the controlled switch 68, 69, 70, 71.

The gate of the transistor 50 is connected to the controller 5.

The controlled switch 68 of the fifth electronic device package 61, the controlled switch 69 of the sixth electronic device package 62, and the third power device 66 form a third half bridge converter HB3. Similarly, the controlled switch 70 of the seventh electronic device package 63, the controlled switch 71 of the eighth electronic device package 64, and the fourth power device 67 form the fourth half bridge converter HB4.

When the module SM1 comprises the sixth terminal 74, if the third half bridge converter HB3 is defect, a connection is established between the fourth terminal 72 and the sixth terminal 74 to bypass the defect third half bridge converter HB3 so that the module SM1 is still transferring electrical energy between the first and fifth terminals 40, 73.

Similarly, if the fourth half bridge converter HB4 is defect, a connection is established between the sixth terminal 74 and the fifth terminal 73 to bypass the defect fourth half bridge converter HB4.

The second embodiment of the module SM1-SMn comprises four half bridge converters so that the towers 17A and 17B comprise even more half bridge converters.

The invention claimed is:

1. A submodule for a power converter, comprising,
a first and a second power storage devices and
a first stack of electronic device packages, the first stack comprising a first, a second, a third, and a fourth electronic device packages, a first and a second end contact surfaces, and a first and a second terminals, wherein:
  each electronic device package comprises an upper contact surface, a lower contact surface, and a controlled switch configured to control a current flowing between the upper contact surface and the lower contact surface of the said electronic device package,
  the second electronic device package is sandwiched between the first and the third device packages, and the third electronic device package is sandwiched between the second and the fourth electronic device packages so that the upper contact surface of an electronic device package is operatively in contact with the lower contact surface of another electronic device package,
  one contact surface of the upper and lower contact surfaces of the first electronic device package is operatively in contact with the second electronic device package, and the other contact surface of the upper and lower contact surfaces of the first electronic device package is the first end contact surface of the first stack, the first end contact surface being operatively in connected with a first end of the first power storage device, the first and second electronic device packages being operatively in contact with the first terminal,
  one contact surface of the upper and lower contact surfaces of the fourth electronic device package is operatively in contact with the third electronic device package, and the other contact surface of the upper and lower contact surfaces of the fourth electronic device package is the second end contact surface of the first stack, the second end contact surface being operatively in contact with a first end of the second power storage device, the third and fourth electronic device packages being operatively in contact with the second terminal,
  the surface of the upper and lower contact surfaces of the second electronic device package operatively in contact with the third electronic device package is further operatively in contact with the second end of the first and the second power storage devices,
  wherein the first power storage device and the first and second electronic device packages form a first half-bridge converter, and the second power storage device and the third and fourth electronic device packages form a second half-bridge converter within the same submodule, the two half-bridge converters being structurally integrated by the stacked arrangement,
  wherein each power storage device comprises a housing, the housing being connected to the second end of the power device.

2. The submodule of claim 1, further comprising a first connection and a second connection, the first connection being connected to the first terminal of the first stack and the second connection being connected to the second terminal of the first stack.

3. The submodule of claim 1, further comprising a first connection and a second connection, a wedge, a third and a fourth power storage devices, and a second stack of electronic device packages, the second stack comprising a fifth, a sixth, a seventh, and an eighth electronic device packages, a third and a fourth end contact surfaces, and a third and a fourth terminals, wherein:
  the sixth electronic device package is sandwiched between the fifth and the seventh electronic device packages, and the seventh electronic device package is sandwiched between the sixth and the eighth electronic device packages so that the upper contact surface of an electronic device package is operatively in contact with the lower contact surface of the other electronic device package,
  one contact surface of the upper and lower contact surfaces of the fifth electronic device package is operatively in contact with the sixth electronic device package, and the other contact surface of the upper and lower contact surfaces of the fifth electronic device package is the third end contact surface of the second stack, the third end contact surface being operatively in contact with a first end of the third power storage device, the fifth and sixth electronic device packages being operatively in contact with the third terminal,
  one contact surface of the upper and lower contact surfaces of the eighth electronic device package is operatively in contact with the seventh electronic device package, and the other contact surface of the upper and lower contact surfaces of the eighth electronic device package is the fourth end contact surface of the second stack, the fourth end contact surface being operatively in contact with a first end of the fourth power storage device, the seventh and eighth electronic device packages being operatively in contact with the fourth terminal,
  the surface of the upper and lower contact surfaces of the sixth electronic device package operatively in contact with the seventh electronic device package is further operatively in contact with the second end of the third and the fourth power storage devices,
  the third power storage device and the fifth and sixth electronic device packages form a third half bridge converter, and the fourth power storage device and the seventh and eighth electronic device packages form a fourth half bridge converter,
  the wedge is sandwiched between the first and the second stacks, one terminal of the first and second terminals is connected to one terminal of the third and fourth terminals, the other terminal of the first and second terminals being connected to the first connection and the other terminal of the third and fourth terminals being connected to the second connection.

4. The submodule of claim 1, wherein the submodule comprises a bypass connection configured to connect the terminal of a defective half-bridge directly to the second end of the associated power storage device so that the submodule continues to transfer power despite the defect.

5. The submodule of claim 1, wherein each controlled switch comprises a field effect transistor or an Injection Enhanced Gate Transistor (IEGT), each being provided in a press-pack electronic device package physically stacked with adjacent packages to form the first stack.

6. The submodule of claim 1, further comprising electronic device package heatsinks, each electronic device package being sandwiched between two heatsinks, the heatsinks being configured to cool each electronic device package.

7. A module comprising, a submodule of claim 1, and two compacting devices, wherein each stack of the submodule being compacted between the two compacting devices.

8. The module of claim 7, wherein each compacting device comprises an insulated plate in contact with a stack of the submodule, a pressure cone and a clamping plate, the pressure cone being sandwiched between the insulated plate and the clamping plate, a plurality of tie rods connecting the clamping plates of the two compacting devices.

9. The module of claim 7, wherein each compacting device comprises an insulated plate in contact with a stack of the submodule and a pressure cone, the pressure cones of the two compacting devices being connected by a clamping bar.

10. The module of claim 7, comprising only the first stack, wherein a clamping plate is connected to the second end of the power storage devices of the first stack.

11. The module of claim 7, comprising the first stack and a second stack, wherein a clamping plates is connected to the one terminal of the first and second terminals connected to one terminal of the third and fourth terminals.

12. A tower comprising a plurality of stacked modules of claim 7, the electronic device packages of the modules being connected in series to form an arm for a multilevel power converter.

13. A power converter comprising at least a first tower and a second tower, both towers having a same number electronic device packages, the electronic device packages of the first tower forming an upper arm and the electronic device packages of the second tower forming a lower arm, the upper arm being operatively coupled to the lower arm via a connecting node to form a phase leg, wherein each of the towers comprises a plurality of submodules according to claim 1, such that each tower inherently includes two half-bridge converters per submodule structurally integrated by the stacked arrangement.

14. The power converter of claim 13, further comprising a controller configured to control the controlled switches.

* * * * *